(12) United States Patent  
Anissimov

(10) Patent No.: US 8,358,077 B2  
(45) Date of Patent: Jan. 22, 2013

(54) FULL WAVE CURRENT SENSE RECTIFIER

(75) Inventor: Viatcheslav Anissimov, Lynn, MA (US)

(73) Assignee: OSRAM SYLVANIA Inc., Danvers, MA (US)

(*) Notice: Subject to any disclaimer, the term of this patent is extended or adjusted under 35 U.S.C. 154(b) by 161 days.

(21) Appl. No.: 12/894,493

(22) Filed: Sep. 30, 2010

(65) Prior Publication Data

US 2012/0081027 A1 Apr. 5, 2012

(51) Int. Cl.
H05B 37/00 (2006.01)
G05F 1/00 (2006.01)

(52) U.S. Cl. .................................. 315/200 R; 315/291

(58) Field of Classification Search .............. 315/200 R, 315/207, 209 SC, 291, 307; 327/127–128, 327/334, 343, 531, 533; 363/74, 78
See application file for complete search history.

(56) References Cited

U.S. PATENT DOCUMENTS

| 3,944,906 | A | * | 3/1976 | Hill et al. ........................ 327/77 |
| 4,158,882 | A | | 6/1979 | Citta |
| 4,187,537 | A | | 2/1980 | Avicola et al. |
| 4,307,305 | A | | 12/1981 | Morris |
| 4,333,141 | A | | 6/1982 | Nagano |
| 4,336,586 | A | | 6/1982 | Lunn |
| 4,523,105 | A | | 6/1985 | Jose et al. |
| 4,564,814 | A | | 1/1986 | Miura et al. |
| 6,914,435 | B2 | * | 7/2005 | Graham ......................... 324/500 |
| 6,975,256 | B1 | | 12/2005 | Bolda et al. |
| 7,129,713 | B2 | * | 10/2006 | Katz .............................. 324/664 |
| 2010/0165527 | A1 | * | 7/2010 | Callahan, Jr. .................... 361/79 |

* cited by examiner

*Primary Examiner* — Minh D A
(74) *Attorney, Agent, or Firm* — Shaun P. Montana

(57) ABSTRACT

A current sense rectifier circuit comprises an assembly input terminal for receiving a current input signal having an alternating current (AC) waveform. A negative half-wave circuit generates a first input signal representative of negative portions of the current input signal. A positive half-wave circuit generates a second input signal representative of positive portions of the current input signal. The negative and positive half-wave circuits each include a single diode and a resistance. A closed-loop amplifier has an inverting input terminal connected to the negative half-wave circuit, and a non-inverting input terminal connected to the positive half-wave circuit. The closed-loop amplifier inverts the first input signal and provides a DC voltage output signal via an output terminal that is a function of the inverted first input signal and the second input signal. An assembly output terminal is connected to the output terminal to receive the DC voltage output signal therefrom.

20 Claims, 8 Drawing Sheets

FULL WAVE CURRENT SENSE RECTIFIER

TECHNICAL FIELD

The present invention generally relates to a circuit capable of conditioning an alternating current (AC) current signal to produce an amplified direct current (DC) voltage signal.

BACKGROUND

Several devices require signal processing to be performed on alternating current (AC) waveforms to amplify and rectify the waveforms so that they can be used by downstream circuitry. In particular, many devices include current feedback circuitry having a current sensor that is applied to a conductor that is carrying AC current. The current sensor generates a signal ("sensed signal"), having an AC waveform, indicative of a level of current flow being carried by the current carrying conductor. In order to process the sensed signal, some downstream circuitry, such as microprocessors and digital signal processors, require that the sensed signal is rectified, and then digitized by an analog-to digital converter. In these devices, the current feedback circuitry must not only rectify the sensed signal, but may need to amplify the sensed signal in order to utilize the dynamic range of the analog-to-digital converter.

One type of current feedback circuitry that has been utilized to rectify and amplify the sensed signal includes a traditional full wave rectifier and a pair of cascaded amplifiers (e.g., first stage amplifier and second stage amplifier).

Another type of current feedback circuit that has been utilized to rectify and amplify the sensed signal includes a half wave rectifier.

SUMMARY

Conventional techniques and systems that rectifier and amplify the sensed signal, such as those described above, suffer from a variety of deficiencies. Namely, in current feedback circuitry that includes a traditional full wave rectifier and a pair of cascaded amplifier, the use of two amplifiers is expensive. Additionally, these devices often produce intolerable levels of error since any error through the first stage amplifier is magnified by the second stage amplifier and compounded with any error caused by the second stage amplifier itself. In current feedback circuitry that includes a half wave rectifier, half of the sensed signal is lost. In addition, a half wave rectifier generally has a longer response time than that of a full wave rectifier due to the necessity of an output filter with a larger time constant.

Embodiments of the present invention provide a current sense rectifier circuit that converts a sensed alternating current (AC) current to a direct current (DC) voltage output signal. The current sense rectifier circuit includes a negative half-wave circuit to produce a first voltage input signal representative of negative half-waves of the sensed AC current signal. The current sense rectifier circuit also includes a positive half-wave circuit to produce a second voltage input signal representative of positive half-waves of the sensed AC current signal. A closed-loop amplifier generates the DC voltage output signal as a function of the first and second voltage input signals. In some embodiments, the negative half-wave and positive half-wave circuits each include a single diode in connection with a resistance. As such, embodiments may thus fundamentally include two diodes, two current sense resistors, and a single closed-loop amplifier. Thus, a limited number of components are utilized to accurately provide full wave rectification, gain, attenuation, normalization, and filtering of voltages across the current sense resistors in order to measure a load current that is connected in series therewith. This may provide significant cost-savings over prior art circuitry, which may include many more components. Further, embodiments also provide thermal stability and good linearity of the input-output transfer characteristic.

In an embodiment, there is provided a current sense rectifier circuit. The current sense rectifier circuit includes: an assembly input terminal to receive a current input signal, the current input signal having an alternating current (AC) waveform; a negative half-wave circuit to generate a first input signal representative of negative portions of the current input signal, the negative half-wave circuit including a single diode in connection with a resistance; a positive half-wave circuit to generate a second input signal representative of positive portions of the current input signal, the positive half-wave circuit including a single diode in connection with a resistance; a closed-loop amplifier having an inverting input terminal, a non-inverting input terminal, and an output terminal, wherein the inverting input terminal is connected to the negative half-wave circuit to receive the first input signal, and the non-inverting input terminal is connected to the positive half-wave circuit to receive the second input signal, wherein the closed-loop amplifier inverts the first input signal, wherein the output terminal generates a direct current (DC) voltage output signal as a function of the inverted first input signal and the second input signal; and an assembly output terminal connected to the output terminal of the closed-loop amplifier to receive the DC voltage output signal therefrom.

In a related embodiment, the single diode of the negative half-wave circuit may include an anode and a cathode, wherein the anode may be connected to the inverting input terminal of the closed-loop amplifier, and the cathode may be connected to the assembly input terminal. In a further related embodiment, the resistance of the negative half-wave circuit may be connected between the anode of the single diode of the negative half-wave circuit and a ground potential.

In another related embodiment, the single diode of the positive half-wave circuit may include an anode and a cathode, wherein the anode may be connected to the assembly input terminal, and the cathode may be connected to the non-inverting input terminal of the closed-loop amplifier. In a further related embodiment, the resistance of the positive half-wave circuit may be connected between the cathode of the single diode of the positive half-wave circuit and a ground potential.

In yet another related embodiment, the current sense rectifier circuit may further include a resistive feedback network defining a gain of the DC voltage output signal. The resistive feedback network may include a first feedback resistor connected between the diode of the negative half-wave circuit and the inverting input terminal of the closed-loop amplifier, and a second feedback resistor having a first end connected to the inverting input terminal of the amplifier and having a second end connected to the to the output terminal of the closed-loop amplifier. In a further related embodiment, the resistive feedback network may further include a capacitor in parallel with the second feedback resistor.

In another further related embodiment, the resistive feedback network may generate a first gain, $A_{neg}$, for portions of the DC voltage output signal that are generated as a function of the first input signal, and the resistive feedback network may generate a second gain, $A_{pos}$, for the portions of the DC voltage output signal that are generated as a function of the second input signal, wherein the first gain and the second gain, $A_{neg}$ and $A_{pos}$, are unequal. In a further related embodiment, the resistance of the positive half-wave circuit may be selected to compensate for the first gain and the second gain being unequal.

In another embodiment, there is provided an electric lamp system. The electric lamp system includes: a lamp; a ballast to generate a current signal to power the lamp, wherein the current signal has an alternating current (AC) waveform; an electrical conductor electrically connecting the lamp to the ballast to provide the generated current signal to the lamp; a current sense rectifier circuit connected to the electrical conductor and to the ballast, wherein the current sense rectifier circuit senses the current signal provided to the lamp via the electrical conductor and generates a direct current (DC) voltage output signal representative of the sensed current signal, wherein the current sense rectifier circuit includes: a negative half-wave circuit to generate a first input signal representative of negative portions of the sensed current signal, the negative half-wave circuit including a single diode in connection with a resistance; a positive half-wave circuit to generate a second input signal representative of positive portions of the sensed current signal, the positive half-wave circuit including a single diode in connection with a resistance; and a closed-loop amplifier having an inverting input terminal, a non-inverting input terminal, and an output terminal, wherein the inverting input terminal is connected to the negative half-wave circuit to receive the first input signal, and the non-inverting input terminal is connected to the positive half-wave circuit to receive the second input signal, wherein the closed-loop amplifier inverts the first input signal, wherein the output terminal generates the DC voltage output signal as a function of the inverted first input signal and the second input signal; wherein the ballast includes a control circuit connected to current sense rectifier circuit to control the current provided to power the lamp as a function of the DC voltage output signal.

In a related embodiment, the sensed current signal may have an amplitude that is between 20 milliamps and 1000 milliamps, and the DC voltage output signal may have an amplitude that is between 0.5 Volts and 5 Volts. In another related embodiment, the single diode of the negative half-wave circuit may include an anode and a cathode, wherein the anode may be connected to the inverting input terminal of the closed-loop amplifier, and the cathode may be connected to the assembly input terminal. In a further related embodiment, the resistance of the negative half-wave circuit may be connected between the anode of the single diode of the negative half-wave circuit and a ground potential.

In yet another related embodiment, the single diode of the positive half-wave circuit may include an anode and a cathode, wherein the anode may be connected to the assembly input terminal, and the cathode may be connected to the non-inverting input terminal of the closed-loop amplifier. In a further related embodiment, the resistance of the positive half-wave circuit may be connected between the cathode of the single diode of the positive half-wave circuit and a ground potential.

In another embodiment, there is provided a current sense rectifier circuit. The current sense rectifier circuit includes: an assembly input terminal to receive a current input signal, said current input signal having an alternating current (AC) waveform; a reference terminal held at a reference voltage; a first diode having an anode and a cathode, wherein the cathode of the first diode is connected to the assembly input; a first current sense resistor connected between the anode of the first diode and the reference terminal, wherein a first voltage drop is generated across the first current sense resistor as a function of current received via the first diode; a second diode having an anode and a cathode, wherein the anode of the second diode is connected to the assembly input terminal; a second current sense resistor connected between the cathode of the second diode and the reference terminal, wherein a second voltage drop is generated across the second current sense resistor as a function of current received via the second diode; a closed-loop amplifier having an inverting input terminal, a non-inverting input terminal, and an output terminal, wherein the inverting input terminal is connected to the anode of the first diode to receive the first voltage drop, and the non-inverting input terminal is connected to the cathode of the second diode to receive the second voltage drop, wherein the output terminal of the closed-loop amplifier provides a direct current (DC) voltage output signal as a function of the first voltage drop and the second voltage drop; and an assembly output terminal connected to the output terminal of the closed-loop amplifier to receive the DC voltage output signal therefrom.

In a related embodiment, the current sense rectifier circuit may further include a resistive feedback network defining a gain of the DC voltage output signal. The resistive feedback network may include: a first feedback resistor connected between the anode of the first diode and the inverting input terminal of the closed-loop amplifier; and a second feedback resistor having a first end connected to the inverting input terminal of the amplifier and having a second end connected to the to the output terminal of the closed-loop amplifier. In a further related embodiment, the resistive feedback network may further include a capacitor in parallel with the second feedback resistor.

In another related embodiment, the resistive feedback network may generate a first gain, $A_{neg}$, for portions of the DC voltage output signal that are generated as a function of the first voltage drop, and the resistive feedback network may generate a second gain, $A_{pos}$, for the portions of the DC voltage output signal that are generated as a function of the second voltage drop, wherein the first gain and the second gain, $A_{neg}$ and $A_{pos}$, may be unequal. In a further related embodiment, the second current sense resistor may have a resistance value that is selected to compensate for the first gain and the second gain being unequal.

BRIEF DESCRIPTION OF THE DRAWINGS

The foregoing and other objects, features and advantages disclosed herein will be apparent from the following description of particular embodiments disclosed herein, as illustrated in the accompanying drawings in which like reference characters refer to the same parts throughout the different views. The drawings are not necessarily to scale, emphasis instead being placed upon illustrating the principles disclosed herein.

DETAILED DESCRIPTION

Figure 1:
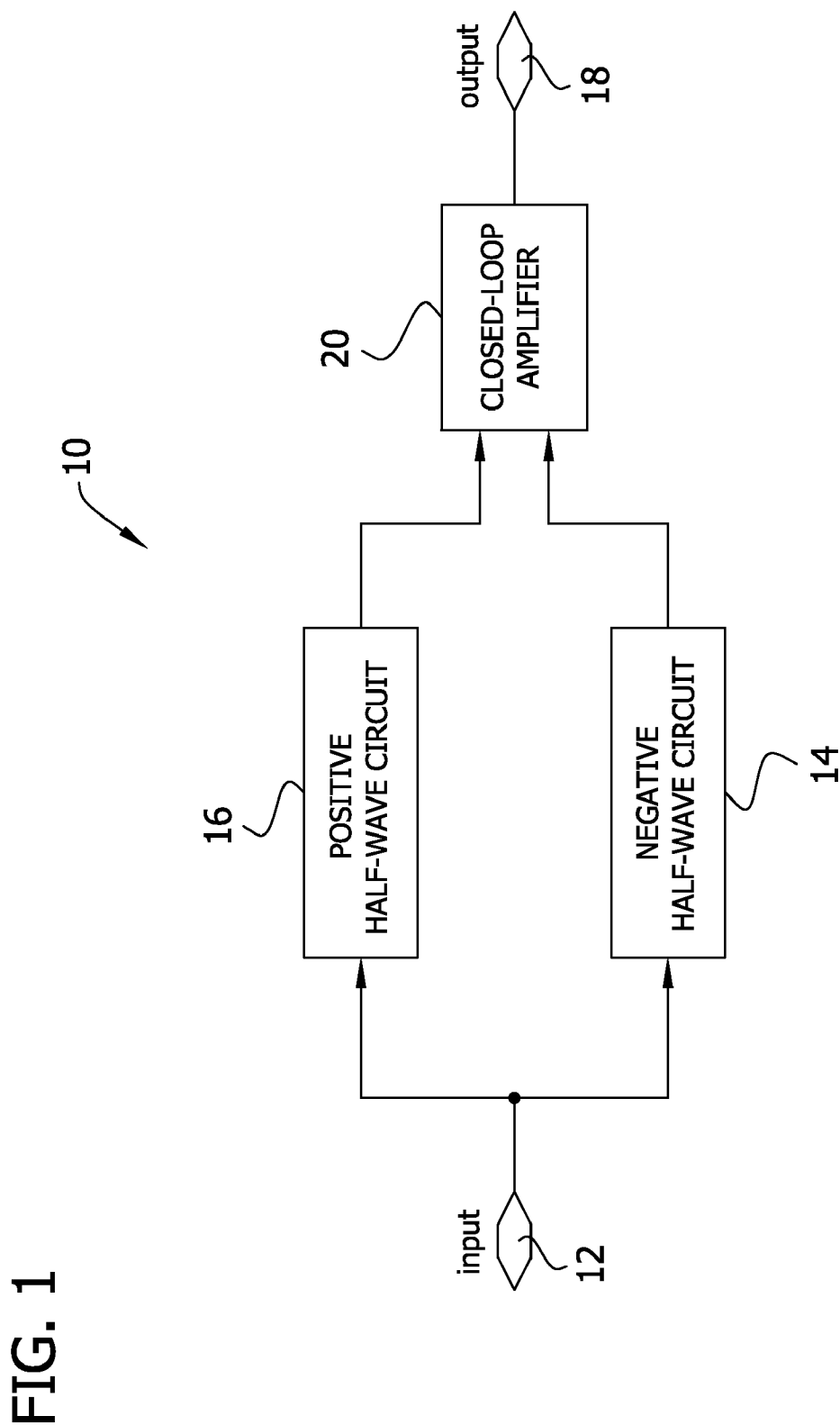
FIG. 1 shows a block diagram of a current sense rectifier circuit according to embodiments disclosed herein.

FIG. 1 is a simplified block diagram of a current sense rectifier circuit 10 to provide current feedback. The current sense rectifier circuit 10 is configured to convert a current input signal having an alternating current (AC) waveform into a direct current (DC) voltage output signal. In general, the current sense rectifier circuit 10 includes an assembly input terminal 12, a negative half-wave circuit 14, a positive half-wave circuit 16, a closed-loop amplifier 20, and an assembly output terminal 18. The assembly input terminal 12 is adapted to receive a current input signal. The current input signal has an AC waveform. Thus, the current input signal includes a series of alternating positive and negative half-waves. For example, the current input signal may be generally characterized as an AC current signal.

The negative half-wave circuit 14 generates a first input signal indicative of negative portions (e.g., negative half-waves) of the current input signal. The positive half-wave circuit 16 generates a second input signal indicative of positive portions of the current input signal (e.g., positive half-wave circuit 16). In some embodiments, the first input signal is a voltage signal comprised of negative half-waves representative of the negative half-waves of the current input signal, while the second input signal is a voltage signal comprised of positive half-waves representative of the positive half-waves of the current input signal. The first input signal and the second input signal each have frequencies that are substantially the same as that of the current input signal.

Figure 2:
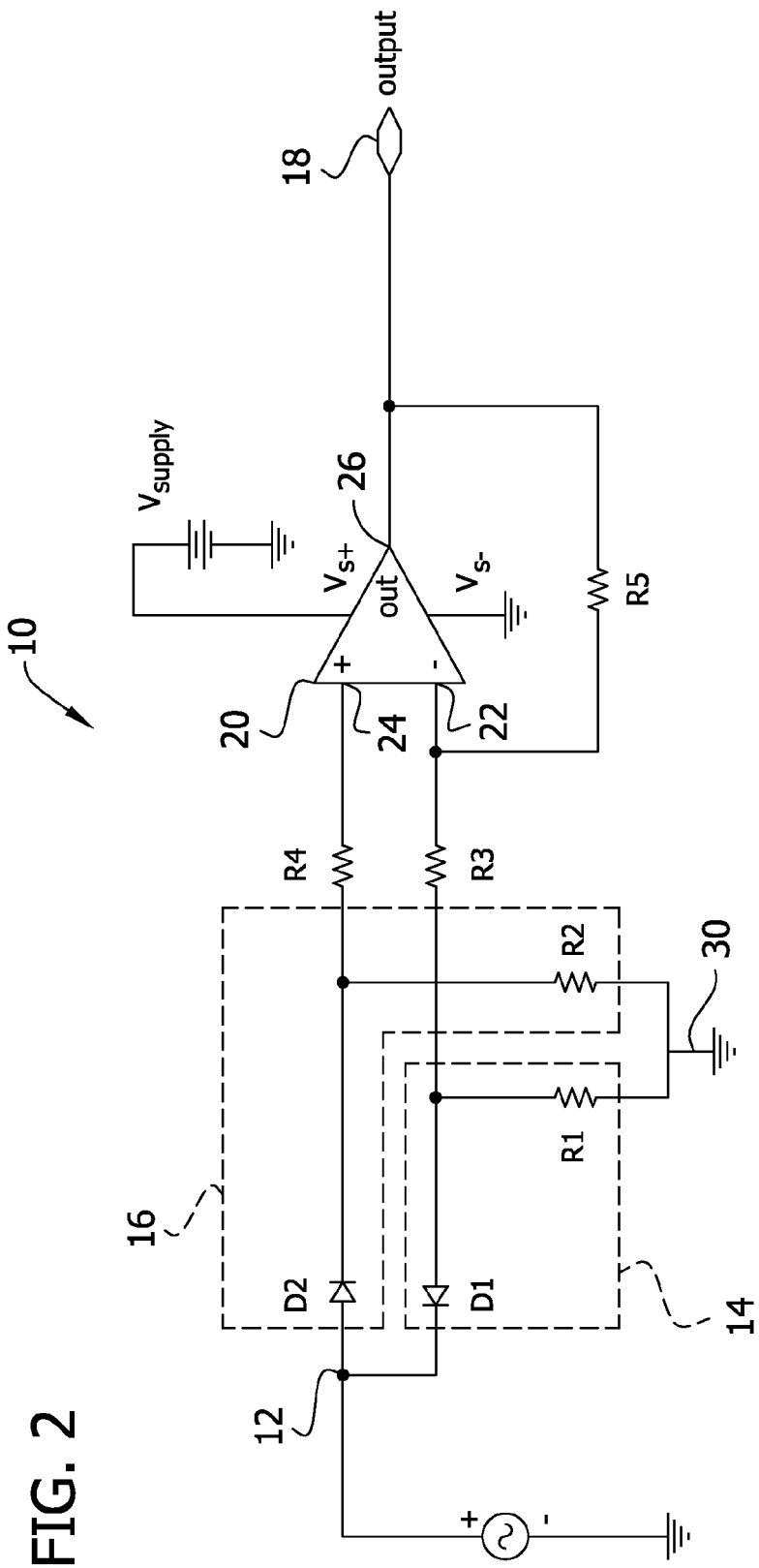
FIG. 2 is a circuit schematic of a current sense rectifier circuit according to embodiments disclosed herein.

The closed-loop amplifier 20 includes an inverting input terminal 22, a non-inverting input terminal 24, and an output terminal 26 (illustrated in FIG. 2). The inverting input terminal 22 is connected to the negative half-wave circuit 14 to receive the first input signal therefrom. The non-inverting input terminal 24 is connected to the positive half-wave circuit 16 to receive the second input signal therefrom. Since the first and second input signals have substantially the same frequency as that of the current input signal (e.g., AC current signal), the amplifier 20 receives alternating negative and positive half cycles from the negative half-wave circuit 14 and the positive half-wave circuit 16, respectively. The amplifier 20 is configured to invert the first input signal. As such, the output terminal 26 of the amplifier 20 provides a DC voltage signal that is a function of the inverted first input signal and the second input signal (broadly, a function of the first and second input signals). The DC voltage signal thus represents a rectified current input signal. The assembly output terminal 18 is connected to the output terminal 26 of the amplifier 20 to receive the DC voltage signal therefrom.

FIG. 2, as stated above, illustrates a circuit schematic of an exemplary current sense rectifier circuit 10. The current sense rectifier circuit 10 includes an assembly input terminal 12 and an assembly output terminal 18, as discussed above in connection with FIG. 1. The current sense rectifier circuit 10 also includes a reference terminal 30 held at a reference voltage (e.g., ground potential). The negative half-wave circuit 14 includes a first diode D1 in connection with a first resistance. The first resistance may be, but is not limited to, a first current sense resistor R1 shown in FIG. 2. The first diode D1 has an anode and cathode. The anode is connected to the inverting input terminal 22 of the amplifier 20, and the cathode is connected to the assembly input terminal 12. The first resistance (i.e., the first current sense resistor R1 in FIG. 2) is connected between the anode of the first diode D1 and the reference terminal 30. The positive half-wave circuit 16 includes a second diode D2 in connection with a second resistance, which may be, but is not limited to, a second current resistor R2 shown in FIG. 2. The second diode D2 has an anode and a cathode. The anode of the second diode D2 is connected to the assembly input terminal 12, and the cathode of the second diode D2 is connected to the non-inverting input 22 of the amplifier 20.

In some embodiments, the amplifier 20 (e.g., closed-loop amplifier) is an operational amplifier connected with a resistive feedback network formed by resistors R3 and R5. As generally known in the art, the amplifier 20 has a positive power supply pin $V_{S+}$ to receive power from a power supply $V_{supply}$, and a negative power supply pin $V_{S-}$ tied to a negative/ground power supply (broadly, "reference voltage supply"). The current sense rectifier circuit 10 includes a first biasing resistor R3 and a second biasing resistor R4 to provide the necessary bias current to the amplifier 20. The first biasing resistor R3 is connected between the anode of the first diode D1 and the inverting input terminal 22 of the amplifier 20. The first biasing resistor R3 may additionally or alternatively function as a feedback resistor as explained below. The second biasing resistor R4 is connected between the cathode of the second diode D2 and the non-inverting input terminal 24 of the amplifier 20.

Figure 3:
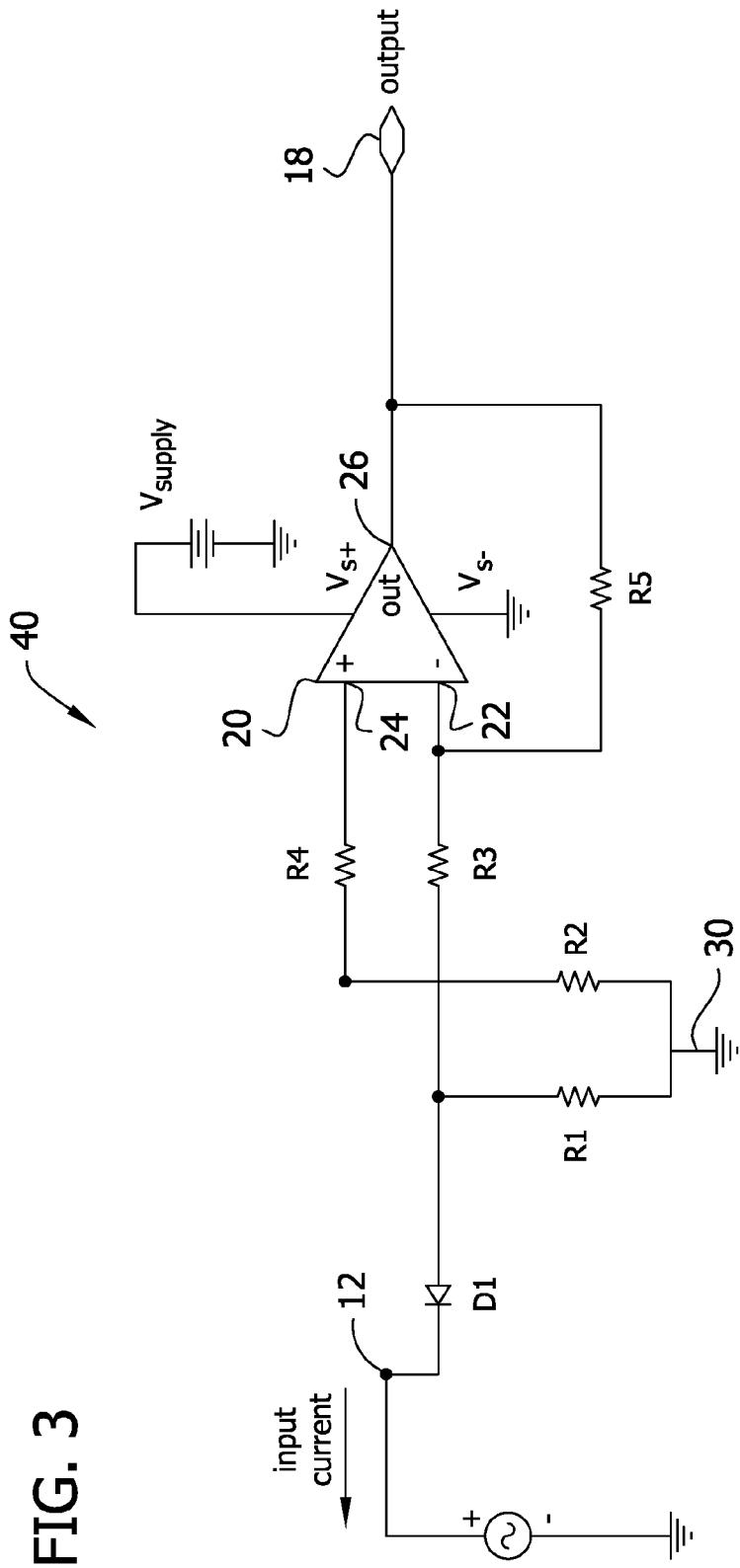
FIG. 3 is an equivalent circuit schematic of a current sense rectifier circuit operating in an inverting mode according to embodiments disclosed herein.

The amplifier 20 is configured to operate in both an inverting stage and a non-inverting stage. FIG. 3 is a circuit schematic illustrating an equivalent circuit 40 of the current sense rectifier circuit 10 when the amplifier 20 is operating in the inverting stage. In particular, when the input current signal is negative, the first diode D1 is forward biased and thereby conducts the input current signal, but the second diode D2 is reversed biased so it does not conduct the input current signal. Thus, the first diode D1 passes the input current signal to the first current sense resistor R1 during the negative half-cycles of the input current signal. As a result, a voltage (e.g., "first voltage drop") is generated across the first current sense resistor R1 as a function of the input current signal during the negative half-cycles. The voltage generated across the first current sense resistor R1 comprises the first input signal which is received at the inverting input 22 of the amplifier 20 causing the amplifier 20 to operate in the inverting stage. During the inverting stage, the amplifier 20 inverts the first input signal. As used herein, the amplifier 20 "inverts" the first input signal by changing the polarity of the first input signal as a function of the amplifier differential input voltage (i.e., voltage at the non-inverting input terminal 24 minus voltage at the inverting input terminal 22).

Figure 4:
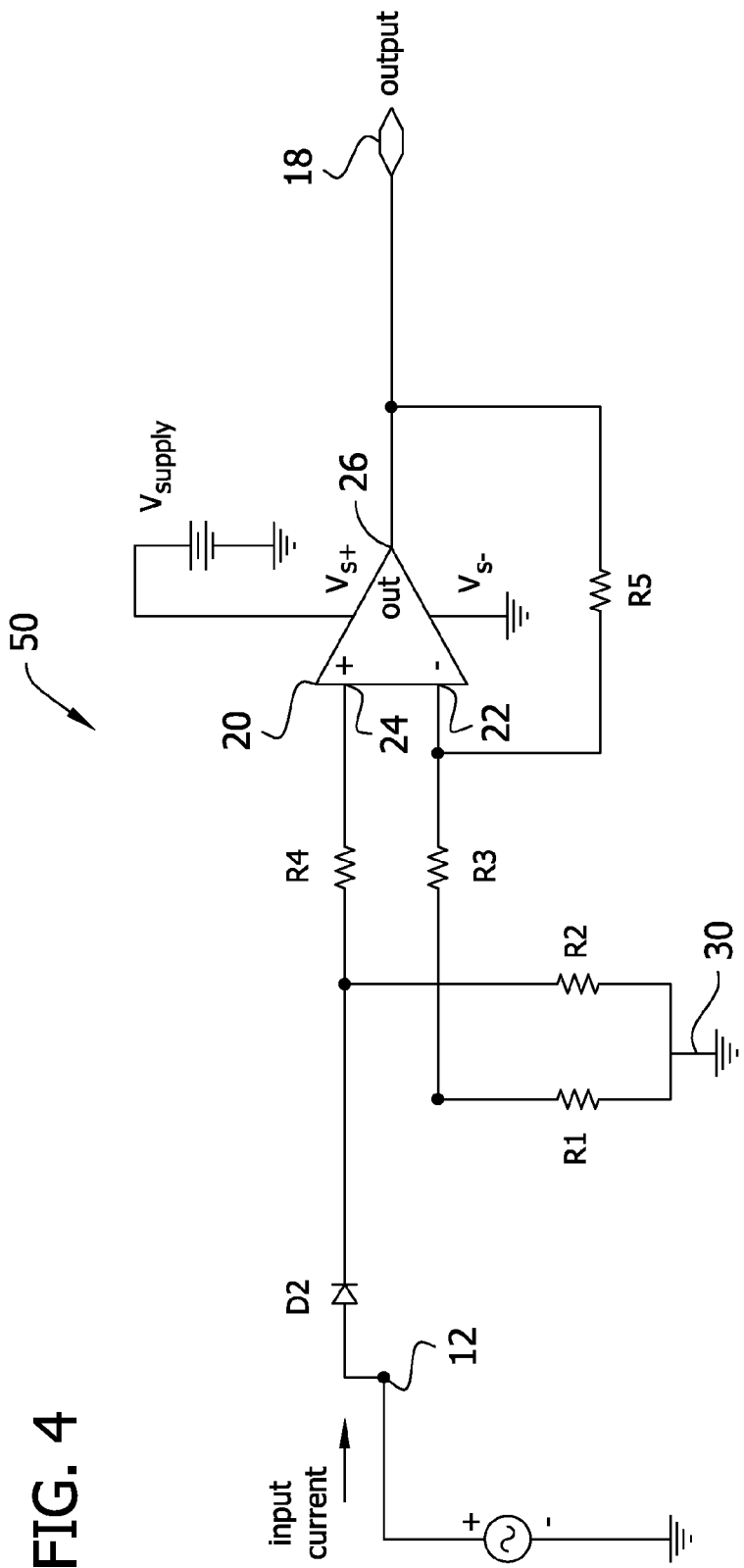
FIG. 4 is an equivalent circuit schematic of a current sense rectifier circuit operating in a non-inverting mode according to embodiments disclosed herein.

FIG. 4 is a circuit schematic illustrating an equivalent circuit 50 of the current sense rectifier circuit 10 when the amplifier 20 is operating in the non-inverting stage. In particular, when the input current signal is positive, the second diode D2 is forward biased and conducts the input current signal, but the first diode D1 is reversed biased so it does not conduct the input current signal. Thus, the second diode D2 passes the input current signal to the second current sense resistor R2 during the positive half-cycles of the input current signal. As a result, a voltage (e.g., "second voltage drop") is generated across the second current sense resistor R2 as a function of the input current signal during the positive half cycles. The voltage generated across the second current sense resistor R2 comprises the second input signal which is received at the non-inverting input 24 of the amplifier 20. Since the amplifier differential input voltage (e.g., voltage at the non-inverting input terminal 24 minus voltage at the inverting input terminal 22) is positive, the amplifier 20 does not change the polarity of the second input signal.

Each cycle of the input current signal includes, in some embodiments, a negative half cycle followed by a positive half cycle, and in other embodiments, a positive half cycle followed by a negative half cycle. Since the input current signal includes alternating (and not simultaneous) positive and negative half cycles, at any given point in time, only one current sense resistor, R1 or R2, has a voltage drop across it. As such, the amplifier 20 alternates between the inverting stage and the non-inverting stage to produce a DC voltage output signal having a series of positive half-waves alternatively representing the negative half cycle of the input current signal and the positive half cycle of the input current signal.

In some embodiments, and as shown in FIGS. 2-4, the amplifier 20 includes a resistive feedback network (R3 and R5) to define a gain (e.g., amplification) for the DC voltage output signal. In particular, the resistive feedback network includes the first biasing resistor R3 (alternatively referred to as "first feedback resistor") and a feedback resistor R5 (alternatively referred to as "second feedback resistor"). The feedback resistor R5 has a first end connected at the inverting input terminal 22 of the amplifier 20, and a second end connected at the output terminal 26 of the amplifier 20. In some embodiments, a compensation capacitor (not illustrated) may be connected in parallel with the feedback resistor R5 to provide compensation for stability in operation. The compensation capacitor may additionally or alternatively be used to provide filtering to the DC voltage output signal.

Referring to FIG. 3, when the amplifier 20 is operating in the inverting stage, the gain $A_{neg}$ is defined as a function of the resistive feedback network as follows:

$$A_{neg} = \frac{-R3}{R5}$$

Referring to FIG. 4, when the amplifier 20 is operating in the non-inverting stage, the gain $A_{pos}$ is a function of the resistive feedback network as follows:

$$A_{pos} = 1 + \frac{R5}{R3 + R1}$$

Figure 5:
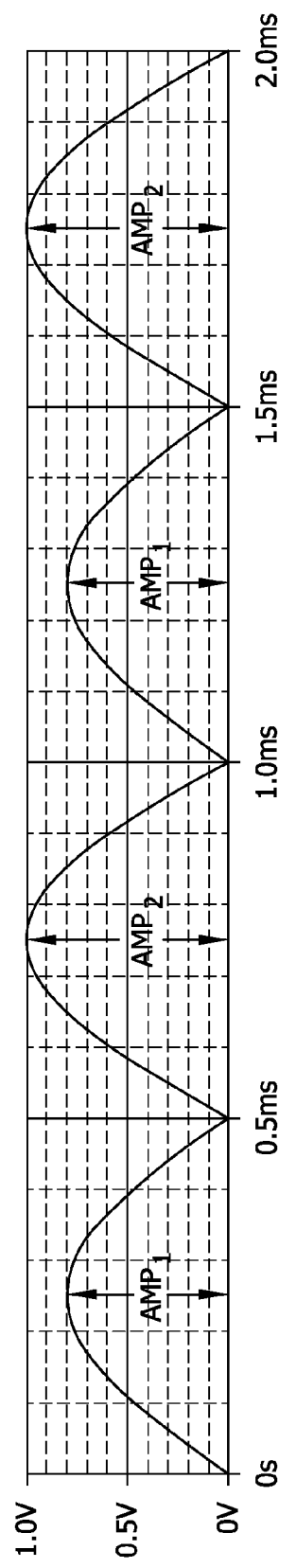
FIG. 5 is an exemplary waveform of a DC voltage output signal generated by a current sense rectifier circuit according to embodiments disclosed herein.

The gains $A_{neg}$ and $A_{pos}$ as defined above are not equal. Accordingly, there might be a distortion in the output signal, if values of the current sense resistors R1 and R2 are equal. As such, as illustrated in FIG. 5, the amplitude $AMP_1$ of the half waves of the DC voltage output signal that correspond to the negative half cycles of the input current signal is not equal to the amplitude $AMP_2$ of the half waves of the DC voltage output signal that correspond to the positive half cycles of the input current. In some embodiments, the voltage drop across the first current sense resistor R1 and/or the second current sense resistor R2 is selected to compensate for the unequal amplitudes $AMP_1$ and $AMP_2$ in order to eliminate a potential presence of a fundamental frequency harmonic in the DC voltage output signal resulting from the unequal amplitudes of the half-waves contained therein. For example, the value of the second current sense resistor R2 may be less than the value of the first current sense resistor R1 so that the voltage drop across the second current sense resistor $V_{R2}$ is less than the voltage drop across the first current sense resistor $V_{R1}$ in accordance with the following equation:

$$V_{R2} = \frac{V_{R1} * |A_{neg}|}{A_{pos}}$$

Accordingly, the resistance value of the second current sense resistor R2 may be selected in accordance with the following equation:

$$R2 = \frac{R1 * |A_{neg}|}{A_{pos}}$$

The values of the other components of the current sense rectifier circuit 10 may be adjusted or additional components may be added for the purpose of compensating for the unequal amplitudes of the half-waves of the DC voltage output signal without departing from the scope of the invention.

Figure 6:
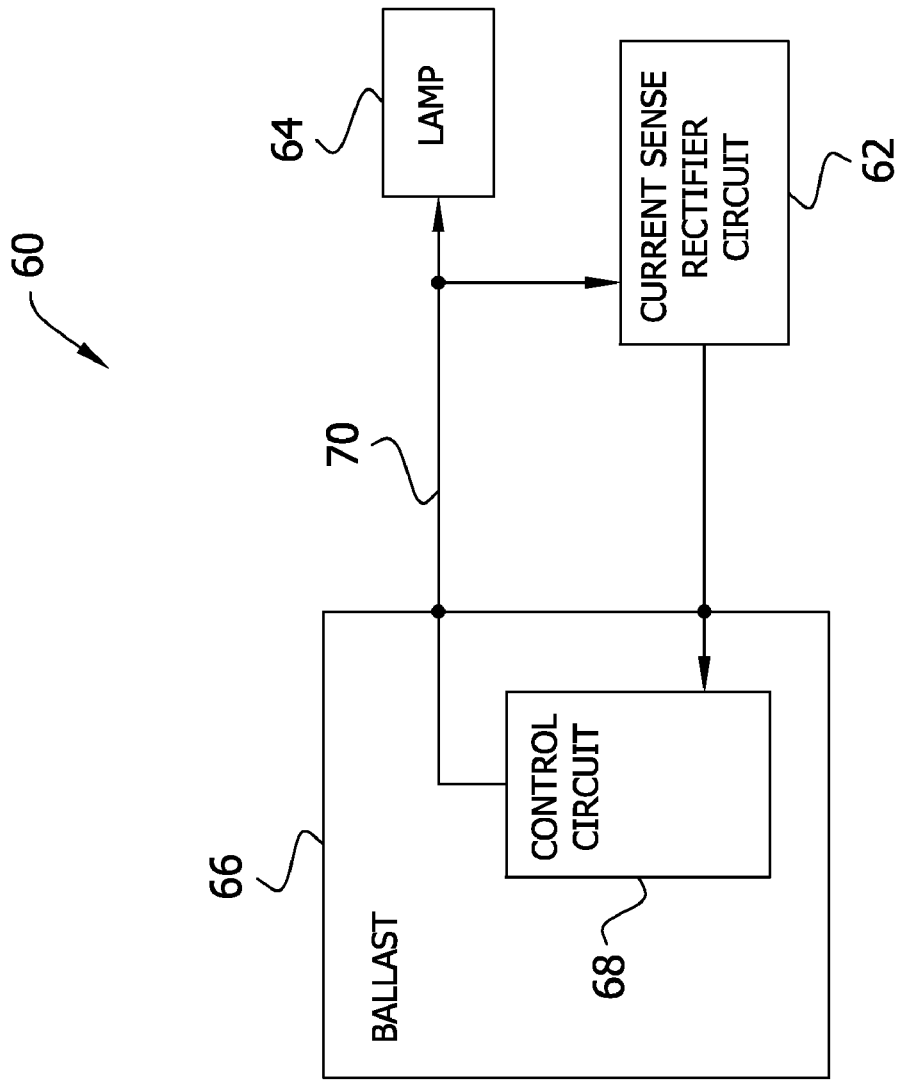
FIG. 6 is an electric lamp system according to embodiments disclosed herein.

FIG. 6 is a block diagram of an electric lamp system 60 that includes a current sense rectifier circuit 62 in accordance with the above description of FIGS. 1-4. The electric lamp system 60 includes a lamp 64, such as but not limited to an electronic gas discharge lamp, and a ballast 66 to generate a current signal to power the lamp 64. The current signal may have an amplitude that is between 20 milliamps and 1000 milliamps. The current signal has an AC waveform. The ballast 66 also includes a control circuit 68 to control the current signal that is generated to power the lamp 64. An electrical conductor 70 electrically connects the lamp 64 to the ballast 66 to provide the generated current signal to the lamp 64. The current sense rectifier circuit 62 is connected to the electrical conductor 70 and to the ballast 66. The current sense rectifier circuit 62 senses the current signal provided to the lamp 64 via the electrical conductor 70 and generates a DC voltage output signal representative of the sensed current signal. In some embodiments, the DC voltage output signal has amplitude that is between 0.5 Volts and 5 Volts. The current sense rectifier circuit 62 provides the DC voltage output signal that is representative of the sensed current signal to the ballast control circuit 68, and the ballast control circuit 68 controls the current provided to power the lamp 64 as a function thereof.

Figure 7:
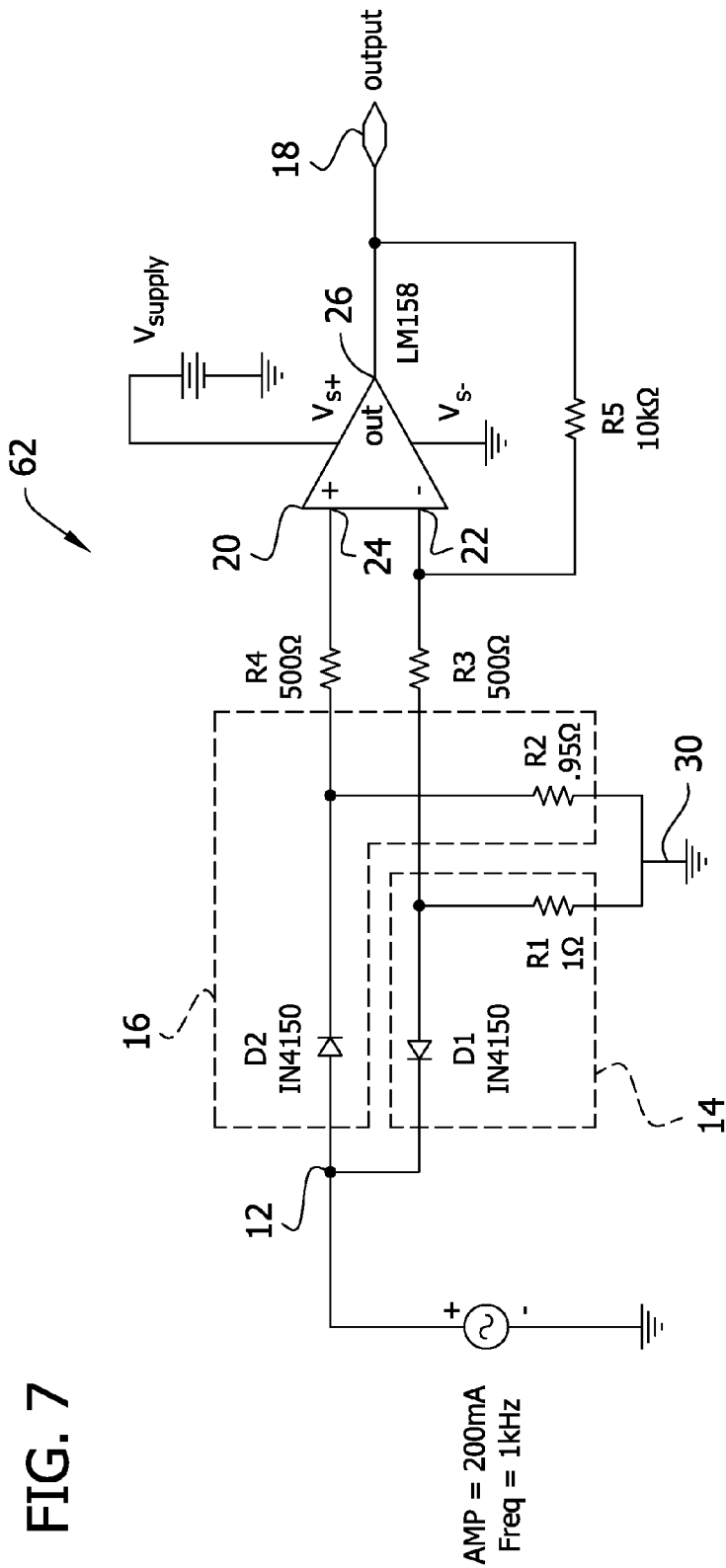
FIG. 7 is a circuit schematic of an exemplary current sense rectifier circuit used in an electric lamp system according to embodiments disclosed herein.

FIG. 7 is circuit schematic of an exemplary current sense rectifier circuit 62 used in an electric lamp system that shows exemplary values for the components of the exemplary current sense rectifier circuit 62. The negative half-wave circuit 14 includes a single diode (D1), such as model number 1N4150 diode available from Fairchild Semiconductor Corporation, in connection with a 1 Ohm resistor (R1). The positive half-wave circuit 16 includes a single diode (D2), such as model number 1N4150 diode available from Fairchild Semiconductor Corporation, in connection with a 0.95 Ohm resistor (R2). The current sense rectifier circuit 62 includes 500 Ohm biasing resistors, R4 and R5, connected at each of the inverting and non-inverting terminals, 22 and 24, of the amplifier 20. The amplifier 20 is the LM158 model amplifier 20 available from national Semiconductor Corporation. The resistive feedback network includes the first 500 Ohm biasing resistor (R3) and a 10 kilo Ohm feedback resistor (R5). A 10 Volt DC power supply ($V_{supply}$) provides power to the positive power supply pin ($V_{S+}$) of the amplifier 20, and the negative power supply pin ($V_{S-}$) of the amplifier 20 is connected to ground.

Figure 8A:
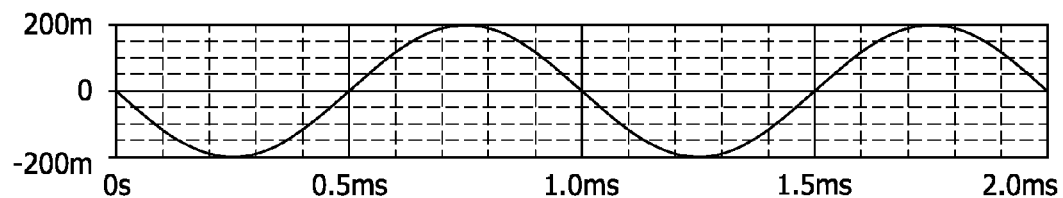
FIG. 8A is an exemplary waveform of an input current signal to a current sense rectifier circuit according to embodiments disclosed herein.
Figure 8B:
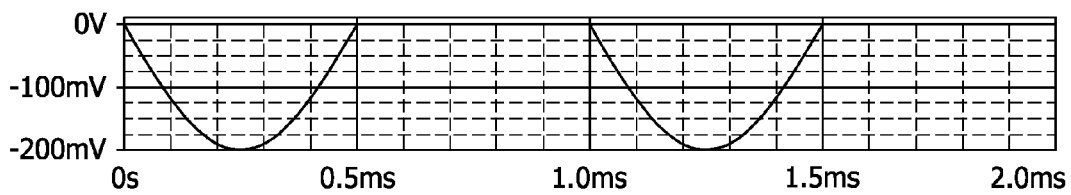
FIG. 8B is an exemplary waveform of an input voltage signal generated by a negative half-wave circuit of a current sense rectifier circuit according to embodiments disclosed herein.
Figure 8C:
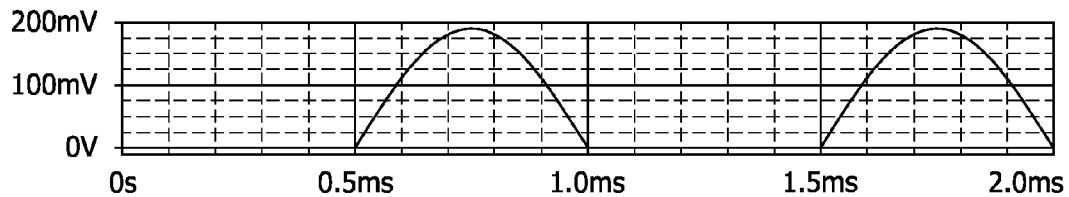
FIG. 8C is an exemplary waveform of an input signal voltage signal generated by positive half-wave circuit of a current sense rectifier circuit according to embodiments disclosed herein.
Figure 8D:
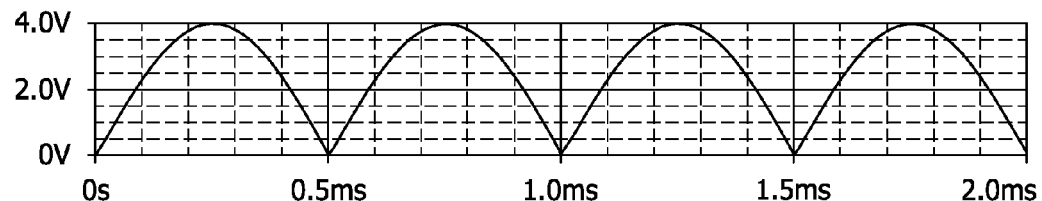
FIG. 8D is an exemplary waveform of a DC voltage output signal generated by a current sense rectifier circuit according to embodiments disclosed herein.

FIGS. 8A-8D illustrate waveforms for signals of embodiments of the current sense rectifier circuit described herein. Referring to FIG. 8A, the current input signal (i.e., "sensed current signal") has an amplitude of 200 milliamps and a frequency of 1 kilohertz. As shown, the current input signal has an AC waveform consisting of alternating negative and positive half-waves. As illustrated by FIG. 8B, the first input signal includes negative half cycles having an amplitude of negative 200 millivolts corresponding to the negative half cycles of the current input signal. FIG. 8C illustrates that the second input signal includes positive half cycles having an amplitude of a little less than 200 millivolts corresponding to the positive half cycles of the current input signal. As shown in FIG. 8D, the DC output voltage signal is a series of positive half waves having an amplitude of 4 Volts. The positive half waves are a function of the inverted negative half cycles of the first input signal alternated with the positive half cycles of the second input signal.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems.

Throughout the entirety of the present disclosure, use of the articles "a" and/or "an" and/or "the" to modify a noun may be understood to be used for convenience and to include one, or more than one, of the modified noun, unless otherwise specifically stated. The terms "comprising", "including" and "having" are intended to be inclusive and mean that there may be additional elements other than the listed elements.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Although the methods and systems have been described relative to a specific embodiment thereof, they are not so limited. Obviously many modifications and variations may become apparent in light of the above teachings. Many additional changes in the details, materials, and arrangement of parts, herein described and illustrated, may be made by those skilled in the art.

What is claimed is:

1. A current sense rectifier circuit comprising:
an assembly input terminal to receive a current input signal, the current input signal having an alternating current (AC) waveform;
a negative half-wave circuit to generate a first input signal representative of negative portions of the current input signal, the negative half-wave circuit including a single diode in connection with a resistance, wherein the single diode of the negative half-wave circuit includes an anode and a cathode;
a positive half-wave circuit to generate a second input signal representative of positive portions of the current input signal, the positive half-wave circuit including a single diode in connection with a resistance;
a closed-loop amplifier having an inverting input terminal, a non-inverting input terminal, and an output terminal, wherein the inverting input terminal is connected to the negative half-wave circuit to receive the first input signal, and the non-inverting input terminal is connected to the positive half-wave circuit to receive the second input signal, wherein the closed-loop amplifier inverts the first input signal, wherein the output terminal generates a direct current (DC) voltage output signal as a function of the inverted first input signal and the second input signal; and
an assembly output terminal connected to the output terminal of the closed-loop amplifier to receive the DC voltage output signal therefrom;
wherein the anode is connected to the inverting input terminal of the closed-loop amplifier, and the cathode is connected to the assembly input terminal, and wherein the resistance of the negative half-wave circuit is connected between the anode of the single diode of the negative half-wave circuit and a ground potential.

2. The current sense rectifier circuit of claim 1 wherein the single diode of the positive half-wave circuit includes an anode and a cathode, wherein the anode is connected to the assembly input terminal, and the cathode is connected to the non-inverting input terminal of the closed-loop amplifier.

3. The current sense rectifier circuit of claim 2 wherein the resistance of the positive half-wave circuit is connected between the cathode of the single diode of the positive half-wave circuit and a ground potential.

4. The current sense rectifier circuit of claim 1 further comprising a resistive feedback network defining a gain of the DC voltage output signal, the resistive feedback network comprising:
a first feedback resistor connected between the diode of the negative half-wave circuit and the inverting input terminal of the closed-loop amplifier; and
a second feedback resistor having a first end connected to the inverting input terminal of the amplifier and having a second end connected to the output terminal of the closed-loop amplifier.

5. The current sense rectifier circuit of claim 4 wherein the resistive feedback network further comprises a capacitor in parallel with the second feedback resistor.

6. The current sense rectifier circuit of claim 4 wherein the resistive feedback network generates a first gain, $A_{neg}$, for portions of the DC voltage output signal that are generated as a function of the first input signal, and the resistive feedback network generates a second gain, $A_{pos}$, for the portions of the DC voltage output signal that are generated as a function of the second input signal, wherein the first gain and the second gain, $A_{neg}$ and $A_{pos}$, are unequal.

7. The current sense rectifier circuit of claim 6 wherein the resistance of the positive half-wave circuit is selected to compensate for the first gain and the second gain being unequal.

8. An electric lamp system comprising:
a lamp;
a ballast to generate a current signal to power the lamp, wherein the current signal has an alternating current (AC) waveform;
an electrical conductor electrically connecting the lamp to the ballast to provide the generated current signal to the lamp;
a current sense rectifier circuit connected to the electrical conductor and to the ballast, wherein the current sense rectifier circuit senses the current signal provided to the lamp via the electrical conductor and generates a direct current (DC) voltage output signal representative of the sensed current signal, wherein the current sense rectifier circuit comprises:

a negative half-wave circuit to generate a first input signal representative of negative portions of the sensed current signal, the negative half-wave circuit including a single diode in connection with a resistance, wherein the single diode of the negative half-wave circuit includes an anode and a cathode;

a positive half-wave circuit to generate a second input signal representative of positive portions of the sensed current signal, the positive half-wave circuit including a single diode in connection with a resistance; and a closed-loop amplifier having an inverting input terminal, a non-inverting input terminal, and an output terminal, wherein the inverting input terminal is connected to the negative half-wave circuit to receive the first input signal, and the non-inverting input terminal is connected to the positive half-wave circuit to receive the second input signal, wherein the closed-loop amplifier inverts the first input signal, wherein the output terminal generates the DC voltage output signal as a function of the inverted first input signal and the second input signal;

wherein the ballast includes a control circuit connected to current sense rectifier circuit to control the current provided to power the lamp as a function of the DC voltage output signal, wherein the anode is connected to the inverting input terminal of the closed-loop amplifier, and the cathode is connected to the electrical conductor so as to receive the AC current signal, and wherein the resistance of the negative half-wave circuit is connected between the anode of the single diode of the negative half-wave circuit and a ground potential.

9. The electric lamp system of claim 8 wherein the sensed current signal has an amplitude that is between 20 milliamps and 1000 milliamps, and the DC voltage output signal has an amplitude that is between 0.5 Volts and 5 Volts.

10. The electric lamp system of claim 8 wherein the single diode of the positive half-wave circuit includes an anode and a cathode, wherein the anode is connected to the assembly input terminal, and the cathode is connected to the non-inverting input terminal of the closed-loop amplifier.

11. The electric lamp system of claim 10 wherein the resistance of the positive half-wave circuit is connected between the cathode of the single diode of the positive half-wave circuit and a ground potential.

12. The electric lamp system of claim 8, wherein the current sense rectifier circuit further comprises a resistive feedback network defining a gain of the DC voltage output signal, the resistive feedback network comprising:

a first feedback resistor connected between the diode of the negative half-wave circuit and the inverting input terminal of the closed-loop amplifier; and a second feedback resistor having a first end connected to the inverting input terminal of the amplifier and having a second end connected to the output terminal of the closed-loop amplifier.

13. The electric lamp system of claim 12, wherein the resistive feedback network further comprises a capacitor in parallel with the second feedback resistor.

14. The electric lamp system of claim 12, wherein the resistive feedback network generates a first gain, $A_{neg}$, for portions of the DC voltage output signal that are generated as a function of the first input signal, and the resistive feedback network generates a second gain, $A_{pos}$, for the portions of the DC voltage output signal that are generated as a function of the second input signal, wherein the first gain and the second gain, $A_{neg}$ and $A_{pos}$, are unequal.

15. The electric lamp system of claim 14, wherein the resistance of the positive half-wave circuit is selected to compensate for the first gain and the second gain being unequal.

16. A current sense rectifier circuit comprising:

an assembly input terminal to receive a current input signal, said current input signal having an alternating current (AC) waveform;

a reference terminal held at a reference voltage;

a first diode having an anode and a cathode, wherein the cathode of the first diode is connected to the assembly input;

a first current sense resistor connected between the anode of the first diode and the reference terminal, wherein a first voltage drop is generated across the first current sense resistor as a function of current received via the first diode;

a second diode having an anode and a cathode, wherein the anode of the second diode is connected to the assembly input terminal;

a second current sense resistor connected between the cathode of the second diode and the reference terminal, wherein a second voltage drop is generated across the second current sense resistor as a function of current received via the second diode;

a closed-loop amplifier having an inverting input terminal, a non-inverting input terminal, and an output terminal, wherein the inverting input terminal is connected to the anode of the first diode to receive the first voltage drop, and the non-inverting input terminal is connected to the cathode of the second diode to receive the second voltage drop, wherein the output terminal of the closed-loop amplifier provides a direct current (DC) voltage output signal as a function of the first voltage drop and the second voltage drop; and an assembly output terminal connected to the output terminal of the closed-loop amplifier to receive the DC voltage output signal therefrom.

17. The current sense rectifier circuit of claim 16 further comprising a resistive feedback network defining a gain of the DC voltage output signal, the resistive feedback network comprising:

a first feedback resistor connected between the anode of the first diode and the inverting input terminal of the closed-loop amplifier; and a second feedback resistor having a first end connected to the inverting input terminal of the amplifier and having a second end connected to the to the output terminal of the closed-loop amplifier.

18. The current sense rectifier circuit of claim 17 wherein the resistive feedback network further comprises a capacitor in parallel with the second feedback resistor.

19. The current sense rectifier circuit of claim 17 wherein the resistive feedback network generates a first gain, $A_{neg}$, for portions of the DC voltage output signal that are generated as a function of the first voltage drop, and the resistive feedback network generates a second gain, $A_{pos}$, for the portions of the DC voltage output signal that are generated as a function of the second voltage drop, wherein the first gain and the second gain, $A_{neg}$ and $A_{pos}$, are unequal.

20. The current sense rectifier circuit of claim 19 wherein the second current sense resistor has a resistance value that is selected to compensate for the first gain and the second gain being unequal.

* * * * *